US012574039B2

(12) United States Patent
Tan

(10) Patent No.: US 12,574,039 B2
(45) Date of Patent: Mar. 10, 2026

(54) REAL-EQUIVALENT-TIME OSCILLOSCOPE AND WIDEBAND REAL-TIME SPECTRUM ANALYZER

(71) Applicant: Tektronix, Inc., Beaverton, OR (US)

(72) Inventor: Kan Tan, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 190 days.

(21) Appl. No.: 18/591,468

(22) Filed: Feb. 29, 2024

(65) Prior Publication Data

US 2024/0313795 A1     Sep. 19, 2024

Related U.S. Application Data

(60) Provisional application No. 63/452,154, filed on Mar. 14, 2023, provisional application No. 63/452,155, filed on Mar. 14, 2023.

(51) Int. Cl.
H03M 1/10          (2006.01)
(52) U.S. Cl.
CPC ......... H03M 1/108 (2013.01); H03M 1/1014 (2013.01); H03M 1/1085 (2013.01)
(58) Field of Classification Search
CPC ...... H03M 1/10; H03M 1/1014; H03M 1/108; H03M 1/1085
See application file for complete search history.

(56) References Cited

U.S. PATENT DOCUMENTS

| | | | | |
|---|---|---|---|---|
| 6,016,112 A | * | 1/2000 | Knudsen ............... | H03M 3/388 |
| | | | | 341/118 |
| 6,885,209 B2 | * | 4/2005 | Mak ....................... | G01R 29/26 |
| | | | | 375/376 |
| 7,629,905 B2 | * | 12/2009 | Dyer ......................... | G06F 1/10 |
| | | | | 341/118 |
| 8,823,573 B1 | * | 9/2014 | Nguyen .................. | H03M 1/12 |
| | | | | 341/155 |
| 10,075,286 B1 | * | 9/2018 | Tan ....................... | H04L 7/0087 |
| 11,789,051 B2 | | 10/2023 | Tan | |
| 12,366,591 B2 | * | 7/2025 | Park ................... | G01R 13/0272 |
| 12,442,837 B2 | * | 10/2025 | Tan .................... | G01R 13/0218 |
| 2004/0189326 A1 | * | 9/2004 | Chikamatsu ........... | G01R 27/28 |
| | | | | 324/650 |
| 2008/0122673 A1 | * | 5/2008 | Dyer .................. | H03M 1/1215 |
| | | | | 341/155 |

(Continued)

*Primary Examiner* — Lam T Mai
(74) *Attorney, Agent, or Firm* — Miller Nash LLP; Andrew J. Harrington

(57)          ABSTRACT

A test and measurement instrument includes one or more channels to receive a signal under test, each channel comprising an input port, a filter, and a sampler, at least one analog-to-digital converter (ADC), the at least one ADC having two pipes connected to the sampler of one of the one or more channels, the at least one ADC to produce digital samples of the signal at a sample rate, and one or more processors configured to execute code that causes the one more processors to acquire a spectrum of the digital samples for each pipe in the at least one ADC, and use the spectrums of the digital samples for each pipe in the at least one ADC to reconstruct the spectrum of the signal under test. A method of operating a test and measurement instrument, and a method a method of calibrating a test and measurement instrument is included.

20 Claims, 19 Drawing Sheets

(56)          References Cited

U.S. PATENT DOCUMENTS

| | | | |
|---|---|---|---|
| 2013/0060527 A1* | 3/2013 | Martin | G01R 13/0254 |
| | | | 702/189 |
| 2014/0232581 A1* | 8/2014 | Nguyen | H03M 1/126 |
| | | | 341/155 |
| 2020/0025812 A1* | 1/2020 | Freidhof | G01R 23/163 |
| 2021/0263085 A1* | 8/2021 | Tan | G01R 13/0218 |
| 2023/0417799 A1* | 12/2023 | Park | H03M 1/1215 |
| 2024/0393369 A1* | 11/2024 | Tan | G01R 13/0218 |
| 2025/0271500 A1* | 8/2025 | Tan | G01R 31/31725 |
| 2025/0277820 A1* | 9/2025 | Lim | G01R 13/0272 |

* cited by examiner

REAL-EQUIVALENT-TIME OSCILLOSCOPE AND WIDEBAND REAL-TIME SPECTRUM ANALYZER

CROSS-REFERENCE TO RELATED APPLICATIONS

This disclosure is a non-provisional of and claims benefit from U.S. Provisional Application No. 63/452,154, titled "REAL-EQUIVALENT-TIME OSCILLOSCOPE AND WIDEBAND REAL-TIME SPECTRUM ANALYZER," filed on Mar. 14, 2023, and U.S. Provisional Application No. 63/452,155, titled "WIDEBAND SIGNAL ANALYZER CALIBRATION," filed Mar. 14, 2023, the disclosures of which is incorporated herein by reference in its entirety.

TECHNICAL FIELD

This disclosure relates to test and measurement instruments, and more particularly to a real-equivalent-time oscilloscope configured to operate as a real-time spectrum analyzer.

BACKGROUND

High-speed signaling continues to progress to higher speed for wired and wireless communications. For example, 400 Gb (Gigabit) and 800 Gb Ethernet are being deployed and developed for data center and support wireless communication as the "backhaul." The 5G wireless is being deployed and 6G wireless is under development. Both 5G and 6G are exploring high frequency bands. For example, 5G wireless explores the mmWave frequency band between 24 GHz and 300 GHz. Wireless 6G explores both mmWave and sub-THz (sub-Terahertz). The radio frequency (RF) range for the test instrument needs to go up to 100 GHz and beyond. Traditionally, the mixers are used to down-convert the high RF band to lower intermediate frequency (IF) band for ADC to convert the analog signal to sampled digital signal. To analyze the wideband 5G, 6G wireless, the instrument needs to support wide IF bandwidth, also called instantaneous bandwidth (IBW), up to 10 GHz and beyond.

As shown in FIG. 1, mobile unit 10 communicates with the base station 12 through the wireless channel 14 in the air space. Base station 12 connects to the server 16 through the wired channel 18, for example, an optical cable. U.S. Pat. No. 11,789,051, issued Oct. 17, 2023, hereinafter "Tan," the contents of which are hereby incorporated by reference into this disclosure, introduced a new type of test and measurement instrument called a real-equivalent-time (RET) oscilloscope. The RET oscilloscopes, as well as the conventional real-time (RT) oscilloscopes and the equivalent-time (ET) sampling oscilloscopes can be used to measure the wired signals in the backhaul. The real-time spectrum analyzers (RTSA), such as the Tektronix RSA7100 series of RTSAs, and the RT oscilloscopes, traditionally measure the wireless signals in the fronthaul. A solution could involve using the capabilities of an RET oscilloscope to measure both the wired and wireless signals.

DETAILED DESCRIPTION

With the deployment of 5G wireless, research and development on 6G wireless under way, there are emerging needs for multi-channel wideband real-time spectrum analyzers (WSA) to measure the "fronthaul" RF signals. The "backhaul" baseband signals such as 400 Gb Ethernet signals also need to be measured. The RET oscilloscope has the capability to measure the high-speed Ethernet signals such as 56 Giga Baud (GBaud) PAM4 (pulse amplitude modulation 4 level). This document describes a RET oscilloscope equipped with bandpass filters that can work as a multi-channel wideband RTSA. The below discussion will refer to the RTSA portion of the test and measurement instrument as a Wideband Signal Analyzer (WSA) with the understanding that it can function as a real-time spectrum analyzer. The single instrument can measure both the RF signals and the baseband signals, and simultaneously if needed since it has multiple channels. The RET oscilloscopes have the benefit of lower cost, lower power consumption, lighter weight compared to the real-time (RT) oscilloscopes, making the RET oscilloscope an attractive alternative solution for 5G/6G wireless system test applications, such as for wireless channel characterization. This application describes a RET-oscilloscope-based instrument that can be used to measure wireless signals with wide IBW and high RF range.

Figures 1, 2:
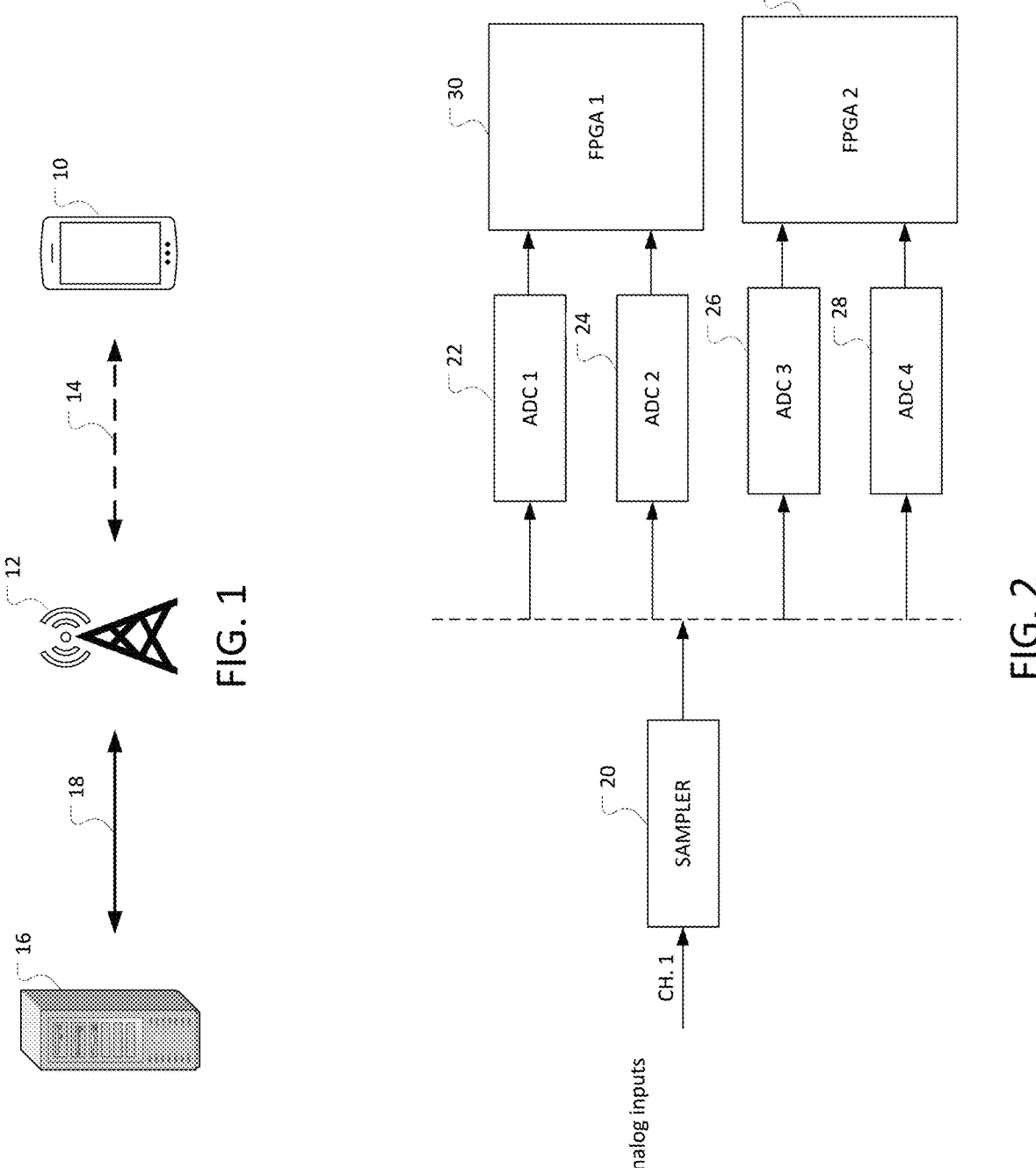
FIG. 1 shows a diagram of a wired and wireless system for 5G/6G wireless.
FIG. 2 shows an embodiment of one channel of a real-time (RT) oscilloscope.

In an RT oscilloscope, the sample rate is high enough to support the analog bandwidth counting from DC to the maximum frequency of the passband. For example, as shown in FIG. 2, four analog-to-digital converters (ADC) 22, 24, 26, and 28, support one of the channels 20 for an RT scope. Each processor, in this embodiment field-programmable gate arrays, 30 and 32, receives the samples from the ADCs. The channel has 110 GHz analog bandwidth. Each ADC samples at 62.5 GS/s (Giga Samples per second) to get a combined 250 GS/s sample rate. Since 250/2=125 is greater than 110, the sample rate is sufficient for RT sampling based on Nyquist sampling theorem. The Nyquist sampling theorem states that a sampler for an analog signal must have a sample rate more than twice the highest frequency component of the signal.

Typically, a high-speed ADC has multiple pipes, for example, one ADC has 4 pipes, or quadrants. Each pipe samples at 62.5/4=15.625 GS/s rate. The typical wireless communication system has narrower IBW (instantaneous bandwidth) than the RF range. For example, the 5G wireless uses the RF range from 3 GHz up to 100 GHz or higher, the typical IBW is below 10 GHz. The discussion sets the IBW as a design target within the 110 GHz RF range. Other targets with different RF and IBW requirements can be achieved similarly by scaling the design accordingly.

Figure 3:
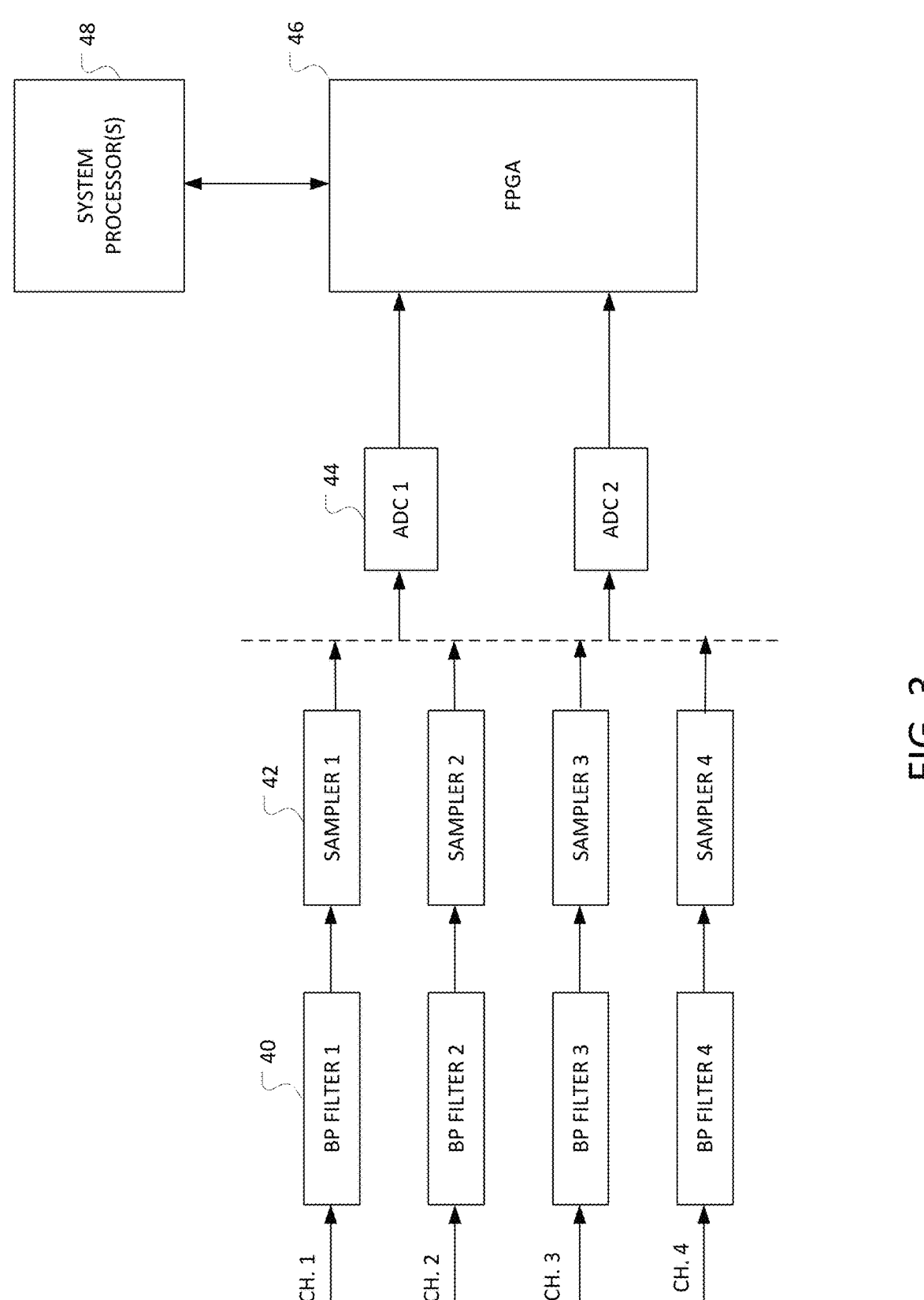
FIG. 3 shows an embodiment of a 4 channel real-equivalent-time (RET) oscilloscope to be used as a WSA.

FIG. 3 shows a structure that enables WSA capability that supports 110 GHz RF range with 12.5 GHz IBW. Each sampler such as 42 supports frequency from DC to 110 GHz. The sampler comprises a track and hold unit that supports 250 GS/s as the samplers shown in FIG. 2. Each sampler in FIG. 3 is connected to two pipes of one ADC such as 44 in the RET oscilloscope configuration. Note that the four channel RET oscilloscope requires ½×4=2 ADCs. In comparison, the 4-channel RT oscilloscope requires 4×4=16 ADCs. The ratio is 1:8. FPGA 46 receives the output from the ADC pipes. One or more processors, such as 48, interacts with the FPGA and other parts of the channel as needed to operate the test and measurement instrument.

Figure 4:
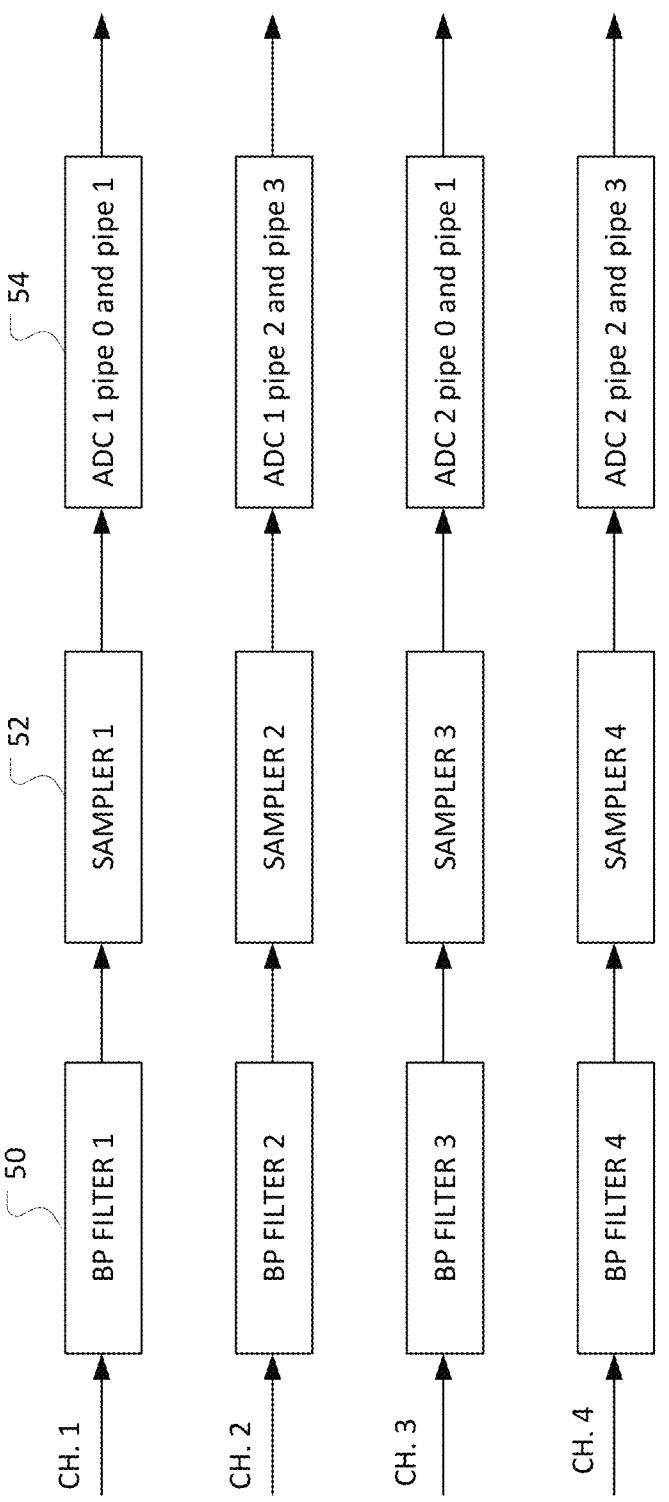
FIG. 4 shows an embodiment of an analog-to-digital converter (ADC) pipe association with samplers in the RET oscilloscope to be used as a WSA.
Figure 5:
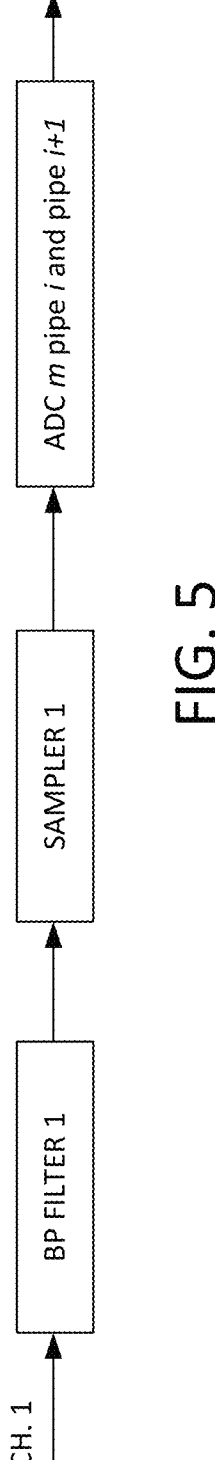
FIG. 5 shows an embodiment of an ADC pipe associated with sampler in one analog channel.

FIG. 4 shows the four channels, each having a bandpass filter such as 50 that enables the WSA capability. The bandpass filter passes the signals of the selected band to sampler 52. The sampler then passes the samples to two pipes of the ADCs such as 54. FIG. 5 shows a more general version of a channel. The analog channel in FIG. 5 employs pipes i and i+1 of ADC m.

Figure 6:
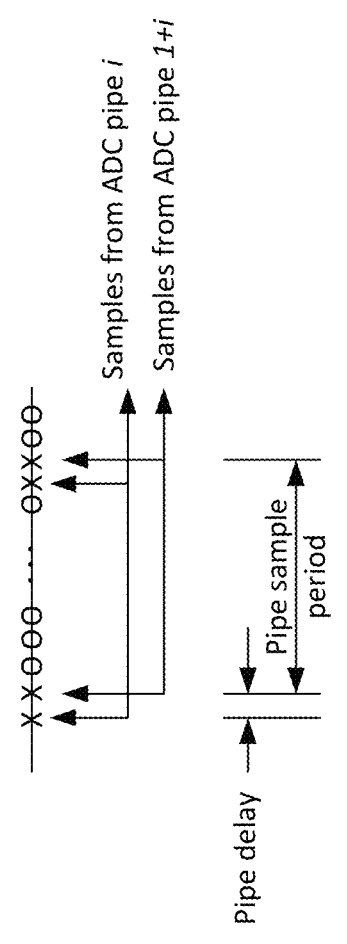
FIG. 6 shows an embodiment of pipe sampling time arrangements.

FIG. 6 shows the sampling time arrangement. The term "pipe delay" as used herein means the delay between the two pipes pipe i and pipe i+1 in the ADC m that supports the sampler n. In this example, the pipe delay is ½₅₀ GS/s=4 ps. The term "pipe sample period" as used herein means the sample period for each pipe. In this example, the pipe sample period equals 1/15.625 GS/s=64 ps. The pipe sample period equals 64 ps/4 ps=16 times of the pipe delay.

The process selects the pipe delay and the pipe sample rate based on the following two conditions. Condition 1 requires the inverse of the pipe delay to be more than twice of the target RF range of the WSA. Condition 2 requires the pipe sample rate to be greater than the target IBW of the WSA.

This example satisfies both conditions. Condition 1 is satisfied since 1/(4 ps)=250 GS/s>2×110 GHz where 110 GHz is the target RF range. Condition 2 is satisfied since $f_s$=15.625 GHz>12.5 GHz where 12.5 GHz is the target IBW and $f_s$ represents the sample rate of each pipe.

The process selects the BP filter based on the following conditions. First, the bandpass filter has a bandwidth greater than the target IBW of the WSA and narrower than the pipe sample rate. The BP filter pass band [$f_1^{pass}$, $f_2^{pass}$] covers the band of frequency of interest [$f_1^{interest}$, $f_2^{interest}$]. The frequency constraints are described in Equation (1) and shown in FIG. 7.

$$f_1 \leq f_1^{stop} < f_1^{pass} \leq f_1^{interest} < f_2^{interest} \leq f_2^{pass} < f_2^{stop} \leq f_2 = f_1 + f_s \quad (1)$$

In this example, the bandpass filter bandwidth lies between the bandwidth of frequency of interest 12.5 GHz, and the pipe sample rate of 15.625 GHz. The BP filter can comprise a fixed filter or tunable filter and can comprise as a filter bank. The process may treat low pass (LP) filters as special BP filters. The BP filters may comprise filters built-in inside the instrument or added as probes or other accessories connected to the instrument.

Figure 8:
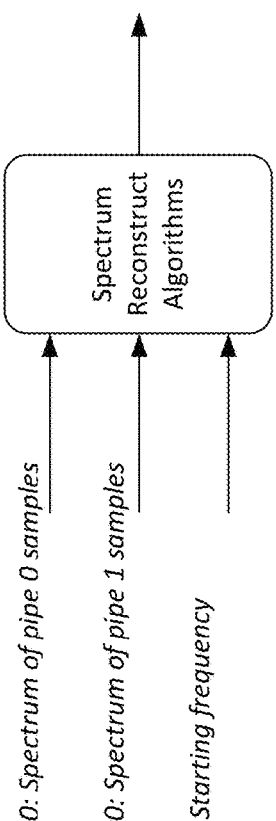
FIG. 8 shows an embodiment of inputs and outputs of a spectrum reconstruct process for an RET oscilloscope to be used as a wideband signal analyzer (WSA).

The spectrum of each pipe can be obtained through FFT on the acquired samples. The spectrum is limited to $f_{Nyquist}$=½$f_s$. In this example, $f_s$=15.625 GS/s. $f_{Nyquist}$=7.8125 GHz. The spectrum reconstruct algorithm shown in FIG. 8 takes in the spectrums from the two pipes and the starting frequency and generates the spectrum of the reconstructed signal as the output. The output has the bandwidth of $f_s$, wider than the band of the frequency of interest. From the output spectrum, the process can select the frequency of interest, $f_{interest}$.

Figure 7:
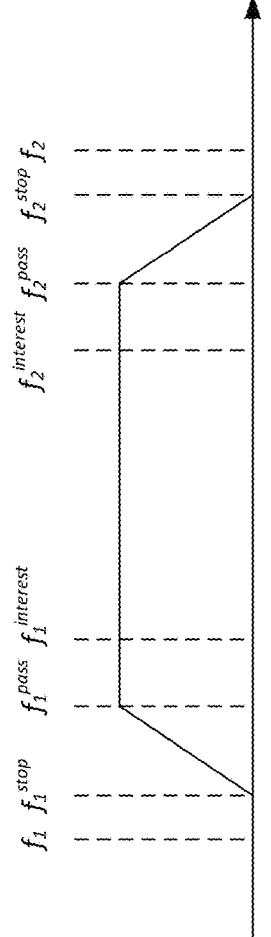
FIG. 7 shows an embodiment of bandpass filter bandwidth constraints.
Figures 9, 10:
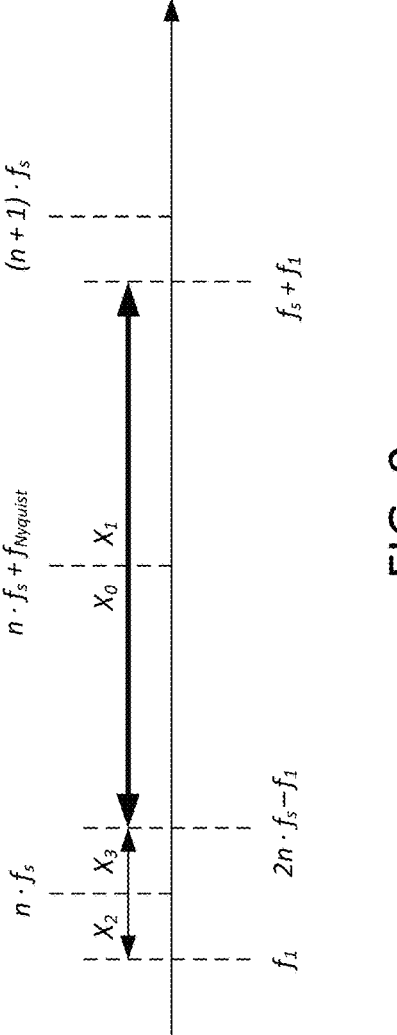
FIG. 9 shows a diagram of a first frequency range of an RF band.
FIG. 10 shows a diagram of a second frequency range of an RF band.

FIG. 7 and Equation (1) show that only the frequency band between $f_1$ and $f_1+f_s$ is passed through the BP filter stage going into the sampler, other frequency components are filtered out by the BP filter. There are two cases to consider for the spectrum reconstruct algorithms. FIG. 9 shows Case 1, where the starting frequency $f_1$ is between a multiple of the sample rate $f_s$ and the multiple of $f_s$ minus the Nyquist frequency $f_{Nyquist}$:

$$nf_s - f_{Nyquist} \leq f_1 < nf_s \quad n \text{ is an integer} \quad (2)$$

FIG. 10 shows Case 2, where the starting frequency $f_1$ is between a multiple of sample rate $f_s$ and the multiple of $f_s$ plus the Nyquist frequency $f_{Nyquist}$:

$$nf_s \leq f_1 < nf_s + f_{Nyquist} \quad n \text{ is an integer} \quad (3)$$

Figure 11:
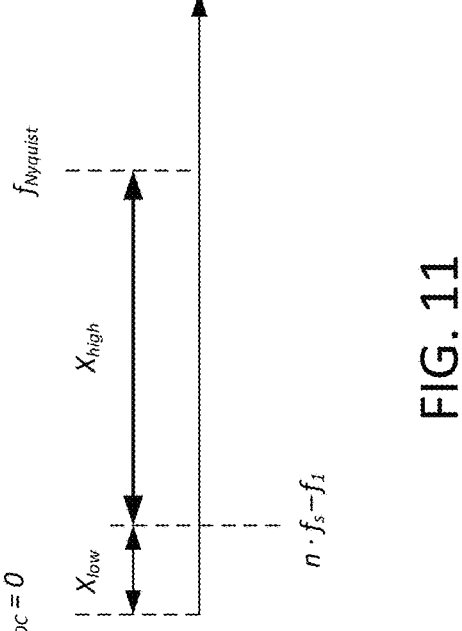
FIG. 11 shows a diagram of a spectrum of samples from a first frequency range case.
Figure 12:
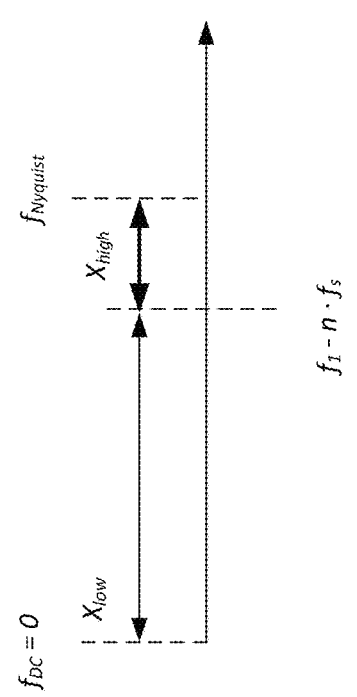
FIG. 12 shows a diagram of a spectrum of samples from a second frequency range case.

For Case 1 and Case 2, when pipe 0 and pipe 1 samples the signal, the frequency components shown in FIG. 9 and FIG. 10 are aliased to DC to $f_{Nyquist}$, as shown in FIG. 11 and FIG. 12, respectively.

For Case 1, the spectrum $X_2$, $X_3$ around $nf_s$ in FIG. 9 are aliased to the lower frequency $X_{low}$ in FIG. 11, the spectrum $X_0$, $X_1$ around $nf_s+f_{Nyquist}$ in FIG. 9 are aliased to the higher frequency $X_{high}$ in FIG. 11.

With the following variable definition:

D: the pipe delay.

$P_0$: the spectrum of pipe 0 samples.

$P_0^{low}$: the lower part of $P_0$ between $f_{DC}$ and $nf_s-f_1$.

$f_{low}$: the frequency of $P_0^{low}$, it is a vector.

$P_0^{high}$: the higher part of $P_0$ between $nf_s-f_1$ and $f_{Nyquist}$.

$f_{high}$: the frequency of $P_0^{high}$, it is a vector.

$P_1$: the spectrum of pipe 1 samples.

$P_1^{low}$: the lower part of $P_1$ between $f_{DC}$ and $nf_s-f_1$.

$P_1^{high}$: the higher part of $P_1$ between $nf_s-f_1$ and $f_{Nyquist}$.

For Case 1, the solution for spectrum segments $X_2$ and $X_3$ in FIG. 9 can be derived and resulting in the following:

$$K1 = e^{-j \cdot D \cdot (nf_s - f_{low}) \cdot 2\pi} \qquad (4)$$

$$K2 = e^{j \cdot D \cdot (nf_s + f_{low}) \cdot 2\pi}$$

$$X_{temp} = \frac{P_1^{low} - K2 \cdot P_0^{low}}{K1 - K2}$$

$$X_3 = P_0^{low} - X_{temp}$$

$$X_2 = \text{flip(complex conjugate}(X_{temp}))$$

The spectrum segments $X_0$ and $X_1$ in FIG. 9 can be derived as the following:

$$K0 = e^{j \cdot D \cdot (nf_s + f_{high}) \cdot 2\pi} \qquad (5)$$

$$K1 = e^{-j \cdot D \cdot (nf_s - f_{high}) \cdot 2\pi}$$

$$X_0 = \frac{P_1^{high} - K1 \cdot P_0^{high}}{K0 - K1}$$

$$X_1 = \text{flip(complex conjugate}(P_0^{high} - X_0))$$

Equation (4) and (5) yield the spectrum of the reconstructed signal.

Like Case 1, the process can derive the solution for Case 2.

The inventors ran a simulated signal sweep from DC to 110 GHz. In the simulation, the two tones are 12.5 GHz apart to demonstrate the spectrum reconstruct algorithms result. As the two tone signal sweeps, the simulation covers both Case 1 and Case 2. The numerical example demonstrates that the RET-oscilloscope-based WSA supports the RF range from DC to 110 GHz and IBW of 12.5 GHz. The spectrum of the analog two tone signal, the spectrum of each of the two pipes, and the spectrum of the reconstructed signal are plotted.

Figure 13:
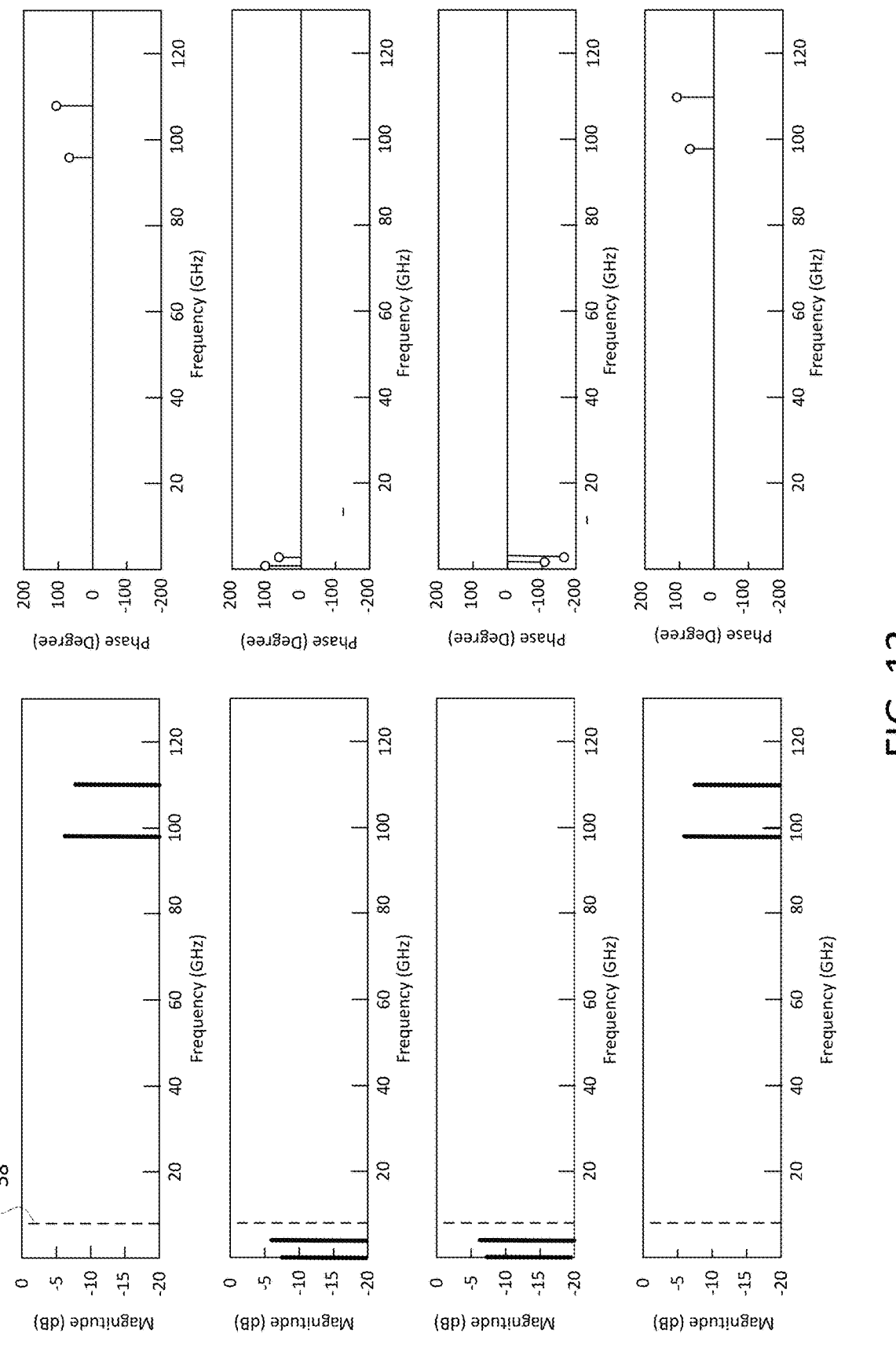
FIG. 13 shows frames of a simulated WSA on an RET oscilloscope showing a high RF frequency range.

FIG. 13 shows one frame from the animated sweep to better illustrate the operation of the disclosed embodiments. The top subplot shows the magnitude spectrum of the analog signal, and its corresponding phase. The middle two subplots show the spectrum and the phase of the pipe 0 and pipe 1 for one ADC. The bottom subplot shows the reconstructed signal spectrum that agrees with the analog signal spectrum shown in the top subplot. The spectra of the two pipes shown in the middle two subplots are bounded by $f_{Nyquist}$ shown as the dotted line 58 in the left side.

Figure 14:
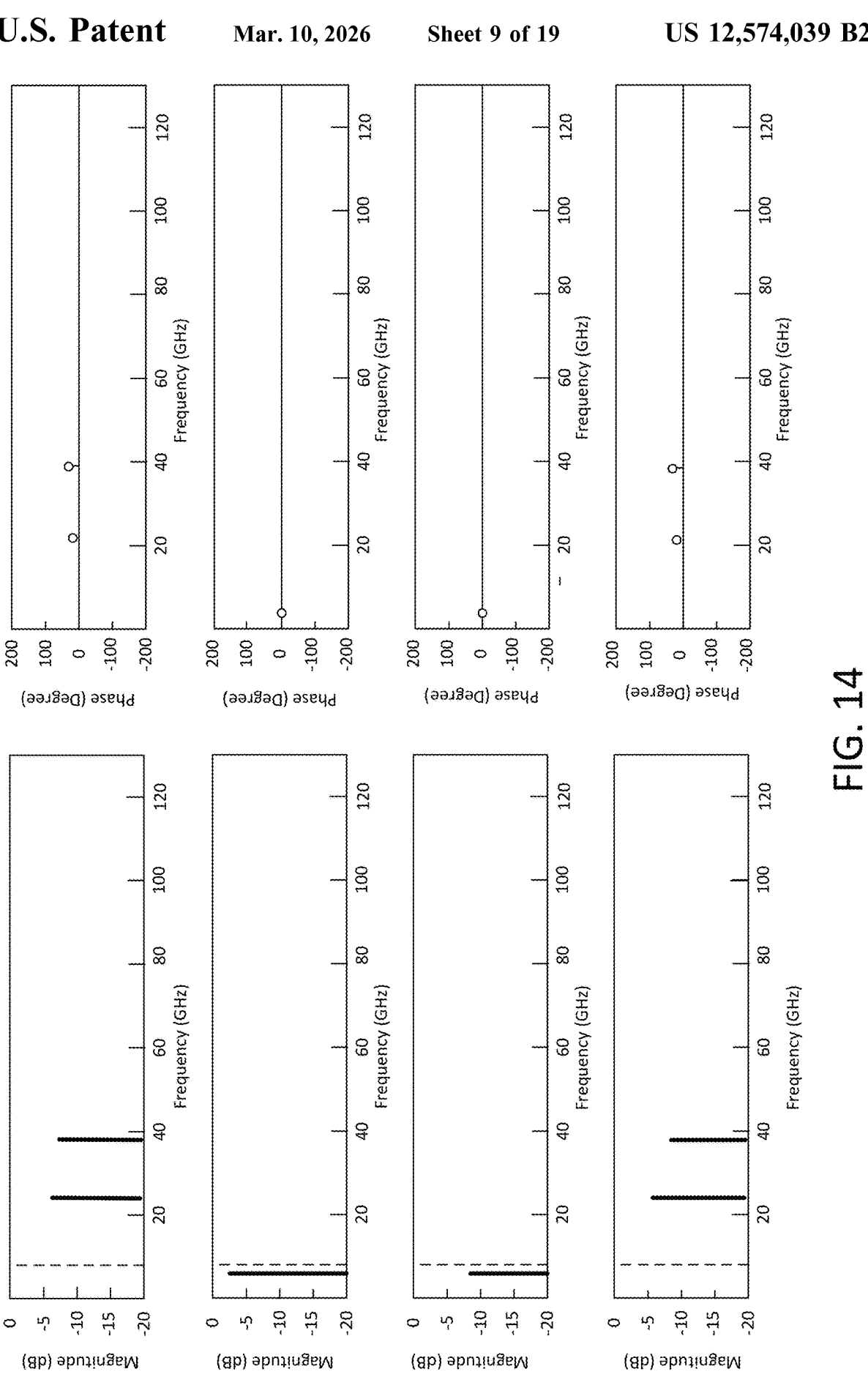
FIG. 14 shows frames of two tones on a simulated wideband spectrum analyzer (WSA) on an RET oscilloscope.

FIG. 14 shows a frame from the simulation for two tones, one at 25 GHz and one at 37.5 GHz, shown in the upper subplot. The two tones are aliased to the same frequency, 6.25 GHz, in the two pipes. In this frame, both magnitude and phase spectra are different for the two pipes, shown in the middle two subplots as pipe 0 and pipe 1. The spectrum reconstruction algorithms recover the analog spectrum as shown in the bottom subplot that agree with the spectrum shown in the top subplot.

Figure 15:
FIG. 15 shows frames showing DC on a simulated WSA on a RET oscilloscope.

The traditional RTSA does not cover DC. The RET oscilloscopes cover DC as shown in FIG. 15.

Referring back to FIG. 6, it shows the RET oscilloscope waveform samples for each channel that it acquired from two pipes. Denote the pipe sample period as $T_s=1/f_s$. The time sequence of the interleaved the samples from the two pipes:

$$\{0, D, T_s, T_s+D, 2T_s, 2T_s+D, 3T_s, 3T_s+D, 4T_s, 4T_s+D, \ldots\}$$

Figure 16:
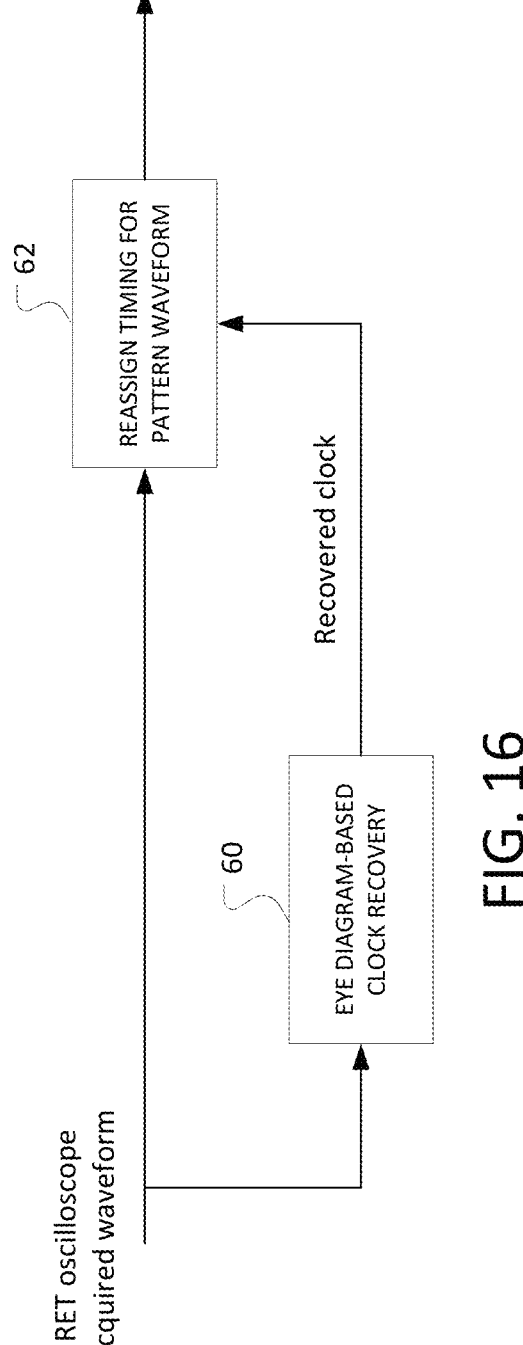
FIG. 16 shows an embodiment of a software clock data recovery (CDR) for an RET oscilloscope.

The software clock recovery shown in FIG. 16 works the same way as in Tan patent. The RET oscilloscope obtains the samples, which will have high aliasing. The RET oscilloscope uses the eye diagrams resulting from the samples to recover the clock and the sampling time at 60. The oscilloscope then uses the recovered clock and the sampling time to re-assign the samples to the right time location in a pattern waveform at 62. The software clock recovery re-assigns the timing of the samples, so the process reorders the incoming samples.

In summary, the RET oscilloscope based WSA can have structures with more pipes. The structure can also expand to other number of analog channels. As a RET oscilloscope has multiple channels, a single RET oscilloscope can test the fronthaul RF signal and the backhaul baseband signal simultaneously, getting time correlated samples.

SFDR (spurious-free dynamic range) and noise represent key requirements for a WSA/RTSA. The RET oscilloscope-based structure has fewer hardware components than the mixer-based RTSA that need calibration for high SFDR performance and noise performance. Using the RET/WSA instrument reduces the complexity of calibration. However, one calibration issue does arise with the RET/WSA instrument.

Up to this, the discussion has assumed that the BP filter, sampler, and ADCs function as "ideal" devices, meaning that they have an ideal frequency response. However, electronic devices rarely function as ideal devices. Therefore, the BP filter, sampler, ADCs, and the WSA need to undergo calibration for the entire RF range. The following discussion uses two pipes of the ADC represent the two signal paths and involve a BP filter, sampler, and ADC pipes, for ease of understanding and to avoid confusion.

The two pipes of ADC for each analog channel in WSA are not ideal and they need to be compensated for their mismatch. The mismatch calibration helps to reduce the inter modulation distortion (IMD) introduced spurs and recover the signal spectrum more accurately. The calibration relies on the characterization of the two ADC pipes. The characterization process uses a step or pulse signal to characterize the frequency responses of the two pipes, and optionally uses swept sine to characterize the magnitude responses more accurately. A numerical example is provided to show the signal spectrum reconstruction process with the calibration.

The above discussion demonstrates when two perfectly matched pipes, such as those in FIG. 2, with ideal frequency responses, it results in a perfect signal spectrum reconstruction.

Figure 17:
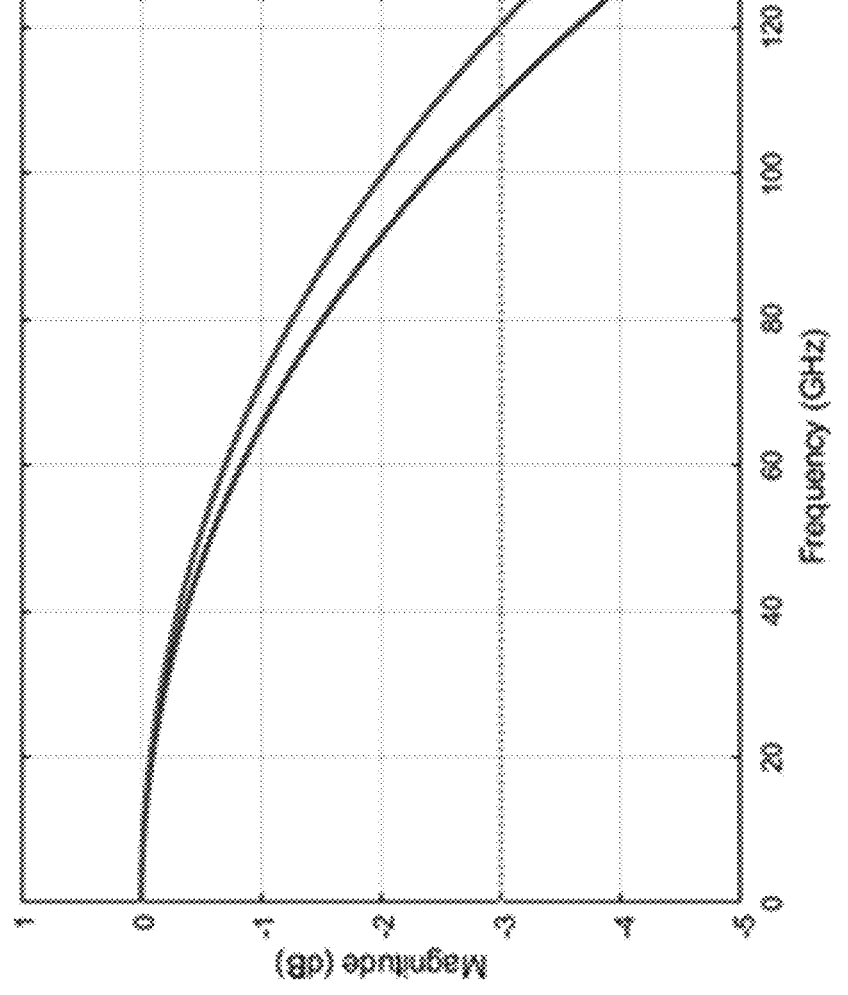
FIG. 17 shows frequency responses of two non-ideal pipes of an ADC.

However, two mismatched pipes have different frequency responses. For example, FIG. 17 shows the frequency responses H0 and H1 for the two pipes. Pipe 0 has more attenuation than pipe 1 as frequency increases. And both pipes have non-flat magnitude frequency responses.

When one feeds a two tone analog signal into this WSA channel, the aliased tones from the two pipes have different magnitudes. For example, the simulation is configured to have each pipe sample at 15.625 GS/s, the delay between the two pipes is 4 ps as shown in FIG. 6, above.

Figure 18:
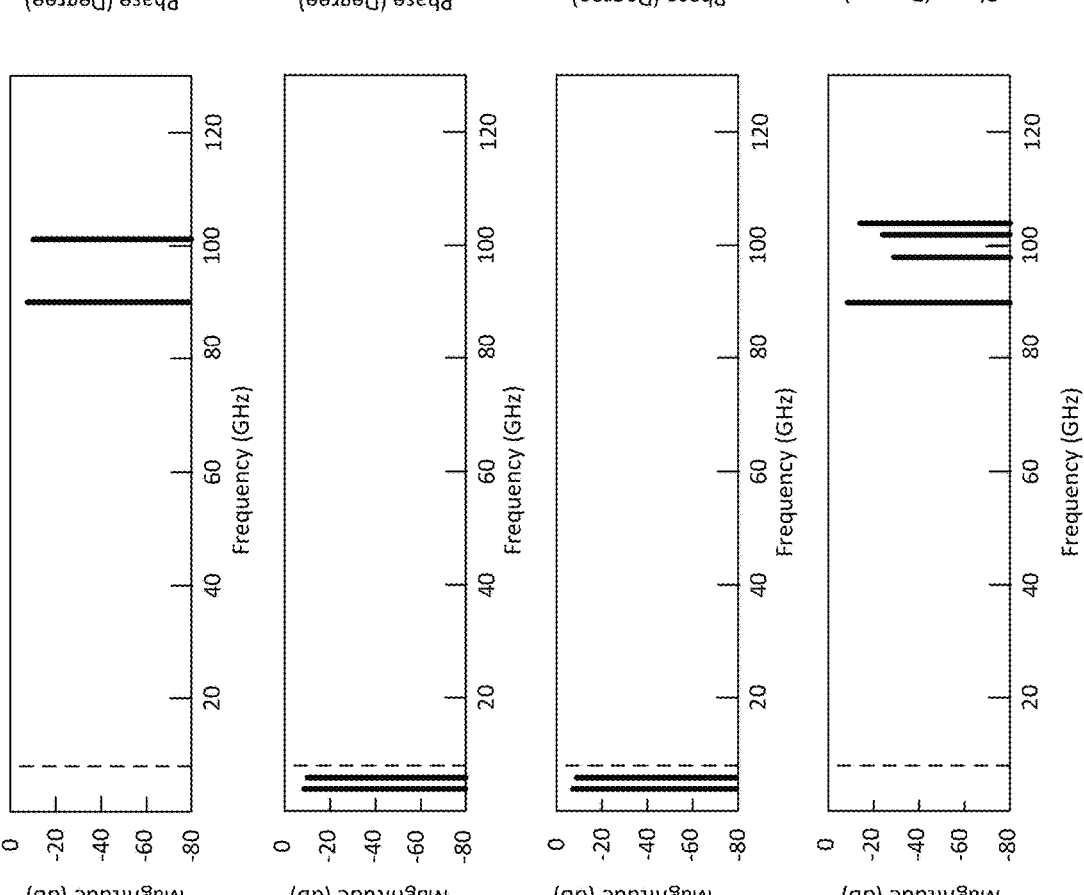
FIG. 18 shows frames of a WSA spectrum without ADC calibration.

As shown in FIG. 18, the input signal's tone at 90 GHz has a magnitude of −6.021 dB, it is aliased to 3.75 GHz in both pipes. The tone at Pipe 0 has magnitude of −7.960 dB, the tone at Pipe 1 has magnitude of −7.635 dB. The spectrum reconstruction algorithm described above in FIG. 7 yields 4 tones. Two of the tones are at the correct frequencies of 90 GHz and 102.5 GHz but have lower magnitudes: the tone at 90 GHz has magnitude of −8.462 dB instead of −6.021 dB for the input signal tone. The reconstruction algorithms generate two extra tones shown in the bottom subplot, they comprise the IMD (intermodulation distortion).

The mismatch between the two pipes and the nonideal frequency responses gives rise to three issues. First, the mismatch between the two pipes causes IMD. It has negative impact on SFDR. Second, the mismatch between the two pipes causes an inaccurate spectrum reconstruction. Third, the nonideal frequency responses of the two pipes cause the inaccurate spectrum reconstruction.

Individual pipe does not have sufficient sample rate to resolve the three issues all by itself. By combing the data from the two pipes, and using the calibration data, the algorithms shown in FIG. 19 can resolve the three issues.

Figure 19:
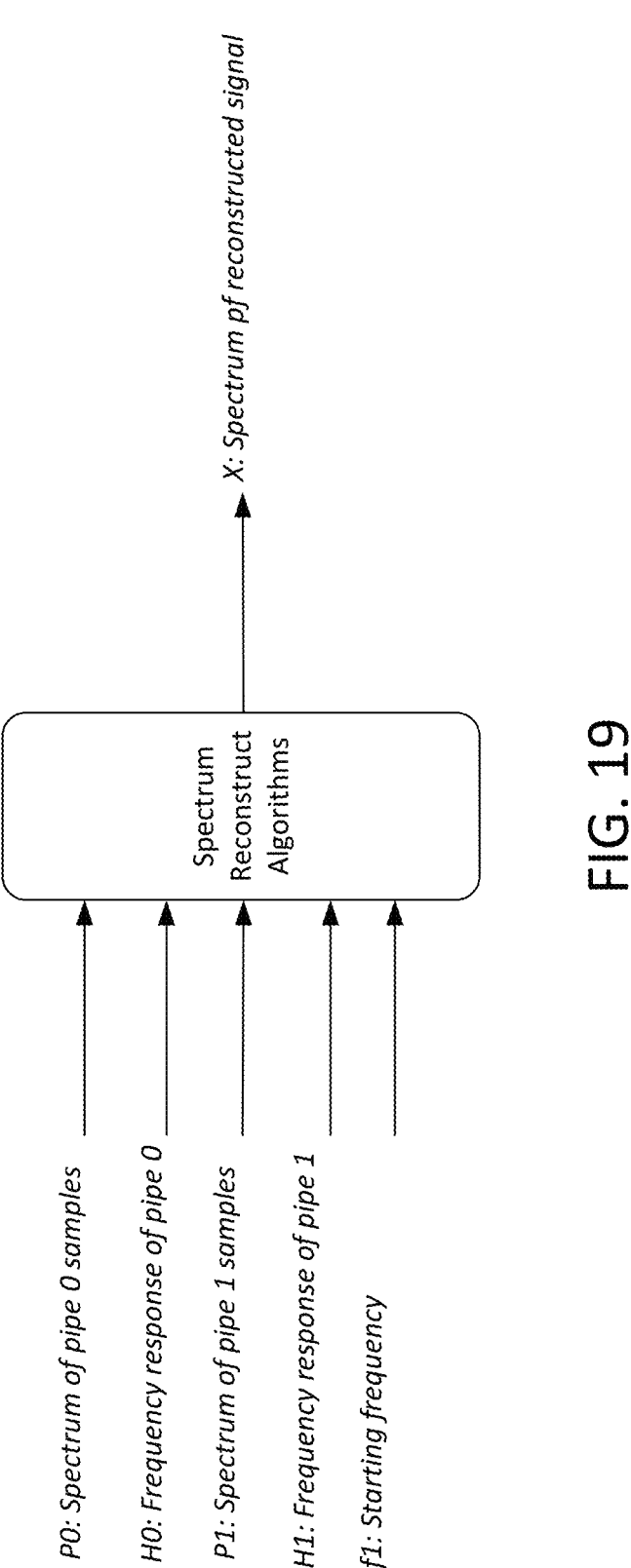
FIG. 19 shows an alternative embodiment of inputs and output for a spectrum reconstruction with calibration.

In FIG. 19, $f_1$ is the starting frequency which satisfies the BP filter constraint defined above. In this example, the bandpass filter bandwidth is between the bandwidth of frequency of interest 12.5 GHz, and the pipe sample rate of 15.625 GHz. The BP filter can be fixed or tunable and can be composed as a filter bank.

The spectrum of each pipe can be obtained through FFT on the acquired samples. The spectrum is limited to $f_{Nyquist} = \frac{1}{2} f_s$. In this example, $f_s = 15.625$ GS/s is the sample rate. $f_{Nyquist} = 7.8125$ GHz is the Nyquist frequency. The calibrated spectrum reconstructs algorithms shown in FIG. 19 takes in the spectra from the two pipes, the characterized frequency responses of the two pipes and the starting frequency, generates the spectrum of the reconstructed signal as the output. The output has the bandwidth of $f_s$, which is wider than the band of the frequency of interest. From the output spectrum, the frequency components of interest can be selected.

FIG. 7 and Equation (1) discussed above show that only frequency band between $f_1$ and $f_1 + f_s$ passes through the BP filter stage and then enters the sampler, other frequency components are filtered out by the BP filter. The process applied to the ideal ADC pipes with matching frequency responses discussed above regarding equations (1), (2), and (3), is repeated for Case 1 and Case 2. The process updates Equations (4) and (5) to reflect the calibration to become Equations (6) and (7).

With the following notations:

D: the pipe delay.

$P_0$: the spectrum of pipe 0 samples.

$P_0^{low}$: the lower part of $P_0$ between DC and $nf_s - f_1$.

$f_{low}$: the frequency of $P_0^{low}$, it is a vector.

$f_{low}^{RfLow}$: the frequency of $X_2$, it is a vector, defined as $$f_{low}^{RfLow} = nf_s - f_{low}$$

$f_{low}^{RfHigh}$: the frequency of $X_3$, it is a vector, defined as $$f_{low}^{RfHigh} = nf_s + f_{low}$$

$H_0$: the frequency response of pipe 0. It covers the full RF range including DC.

$H_0^{LC}$: complex conjugate of $H_0$ at $f_{low}^{RfLow}$.

$H_0^{LB}$: $H_0$ at $f_{low}^{RfHigh}$.

$H_1$: the frequency response of pipe 1. It covers the full RF range including DC.

$H_1^{LC}$: complex conjugate of $H_1$ at $f_{low}^{RfLow}$.

$H_1^{LB}$: $H_1$ at $f_{low}^{RfHigh}$.

$P_0^{high}$: the higher part of $P_0$ between $nf_s - f_1$ and $f_{Nyquist}$.

$f_{high}$: the frequency of $P_0^{high}$, it is a vector.

$P_1$: the spectrum of pipe 1 samples.

$P_1^{low}$: the lower part of $P_1$ between $f_{DC}$ and $nf_s - f_1$.

$P_1^{high}$: the higher part of $P_1$ between $nf_s - f_1$ and $f_{Nyquist}$.

$f_{high}^{RfLow}$: the frequency of $X_0$, it is a vector, defined as $$f_{high}^{RfLow} = nf_s + f_{high}$$

$f_{high}^{RfHigh}$: the frequency of $X_1$, it is a vector, defined as $$f_{high}^{RfHigh} = (n+1)f_s - f_{high}$$

$H_0^{HC}$: complex conjugate of $H_0$ at $f_{high}^{RfHigh}$.

$H_0^{HB}$: $H_0$ at $f_{high}^{RfLow}$.

$H_1^{HC}$: complex conjugate of $H_1$ at $f_{high}^{RfHigh}$.

$H_1^{LB}$: $H_1$ at $f_{high}^{RfLow}$.

For Case 1, the solution for spectrum segments $X_2$ and $X_3$ in FIG. 9 can be derived as following:

$$K1 = e^{-j \cdot D \cdot (nf_s - f_{low}) \cdot 2\pi} \tag{6}$$

$$K2 = e^{j \cdot D \cdot (nf_s + f_{low}) \cdot 2\pi}$$

$$X_{temp} = \frac{H_0^{LB} \cdot P_1^{low} - H_1^{LB} \cdot K2 \cdot P_0^{low}}{H_0^{LB} \cdot H_1^{LC} \cdot K1 - H_0^{LC} \cdot H_1^{LB} \cdot K2}$$

$$X_3 = \frac{P_0^{low} - H_0^{LC} \cdot X_{temp}}{H_0^{LB}}$$

$$X_2 = \text{flip(complex conjugate}(X_{temp}))$$

The spectrum segments $X_0$ and $X_1$ in FIG. 9 can be derived as following:

$$K0 = e^{j \cdot D \cdot (nf_s + f_{high}) \cdot 2\pi} \tag{7}$$

$$K1 = e^{-j \cdot D \cdot ((n+1)f_s - f_{high}) \cdot 2\pi}$$

$$X_0 = \frac{H_0^{HC} \cdot P_1^{high} - H_1^{HC} \cdot K1 \cdot P_0^{high}}{H_0^{HC} \cdot H_1^{HB} \cdot K0 - H_1^{HC} \cdot H_0^{HB} \cdot K1}$$

$$X_1 = \text{flip}\left(\text{complex conjugate}\left(\frac{P_0^{high} - H_0^{HB} \cdot X_o}{H_0^{HC}}\right)\right)$$

Equation (6) and (7) use calibration data and yield the reconstructed spectrum of the signal.

The solution for Case 2 can be derived alike for Case 1.

Figure 20:
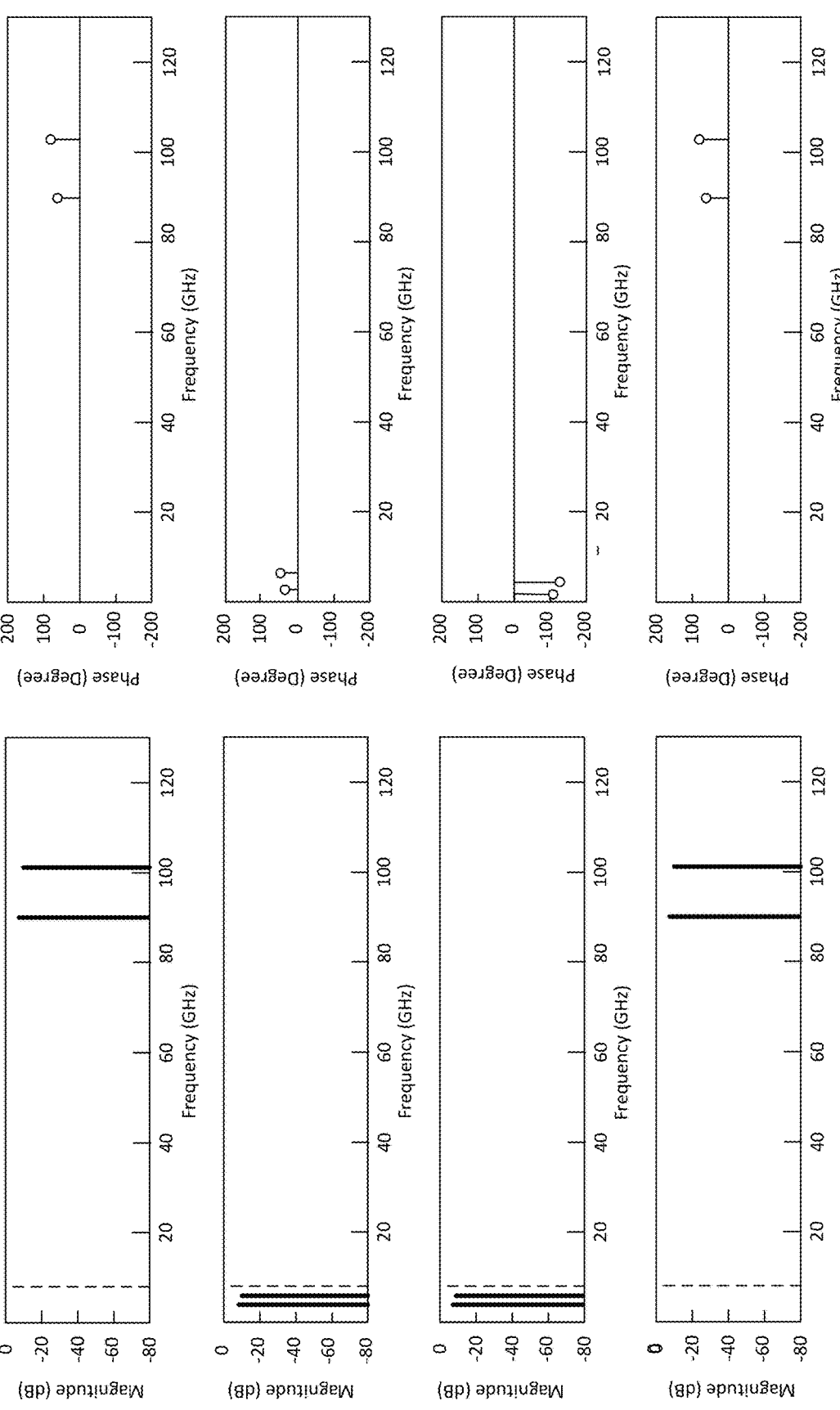
FIG. 20 shows frames of a WSA spectrum with ADC calibration.

Using Equation (6) and (7), the reconstructed spectrum for the example in FIG. 18 is shown in FIG. 20, the reconstructed spectrum equals the spectrum of the input signal. The errors from mismatch between pipes and non-ideal frequency responses of the two pipes have been compensated through calibration.

Figure 21:
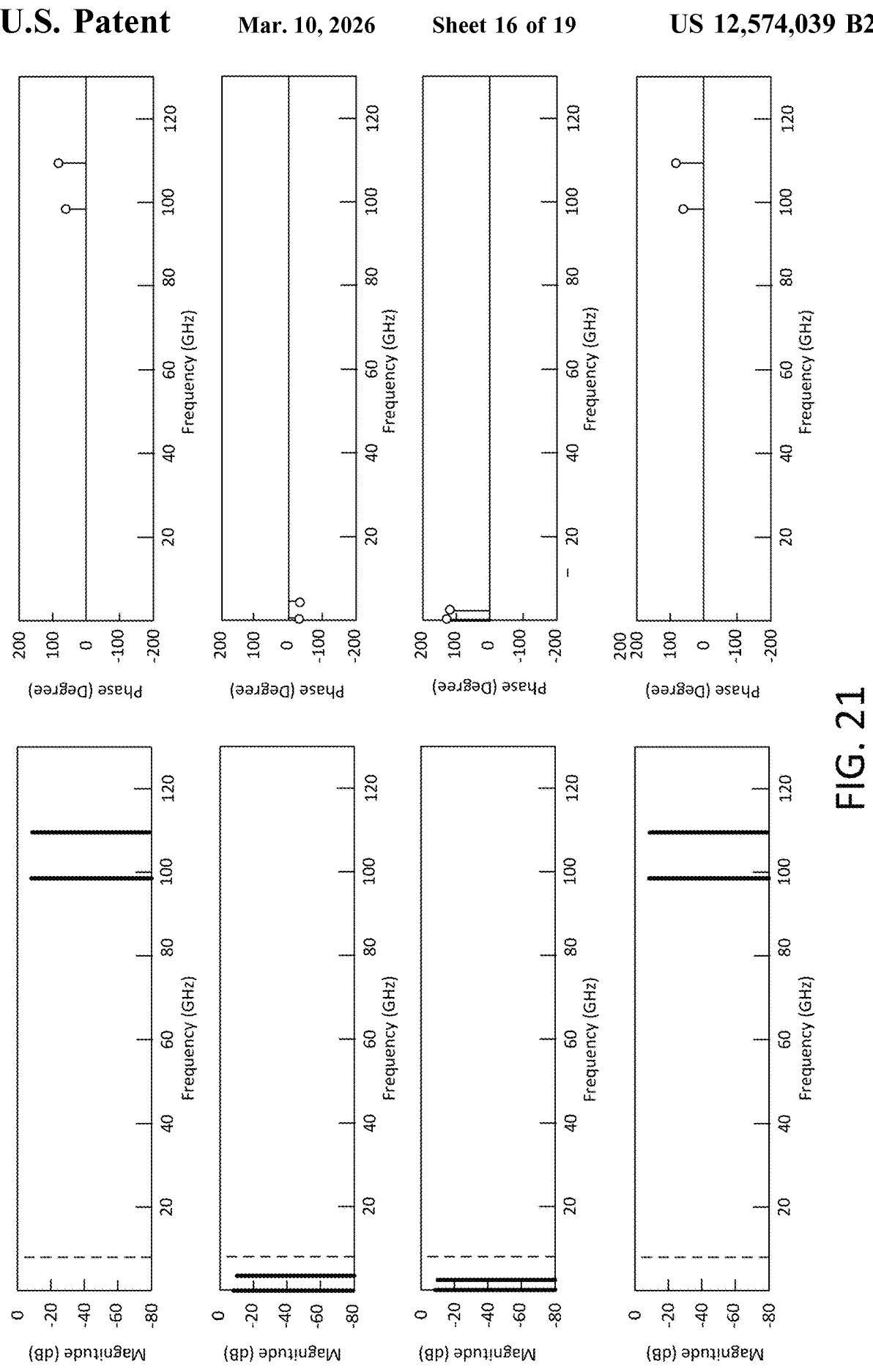
FIG. 21 shows frames of a WSA for a high frequency signal.

The process applies calibration and the simulation results in calibrated examples. FIG. 21 shows the spectra of the two pipes bounded by $f_{Nyquist}$ shown the dotted lines in the left of the two subplots in the middle, similar to FIG. 13. In the subplot shown in FIG. 21, the magnitude spectra differ between the two pipes as the two pipes are not matched, the phases are different. The calibrated spectrum reconstruction algorithms recover the analog spectrum by compensating the mismatch and the nonideal responses of the two pipes.

Figure 22:
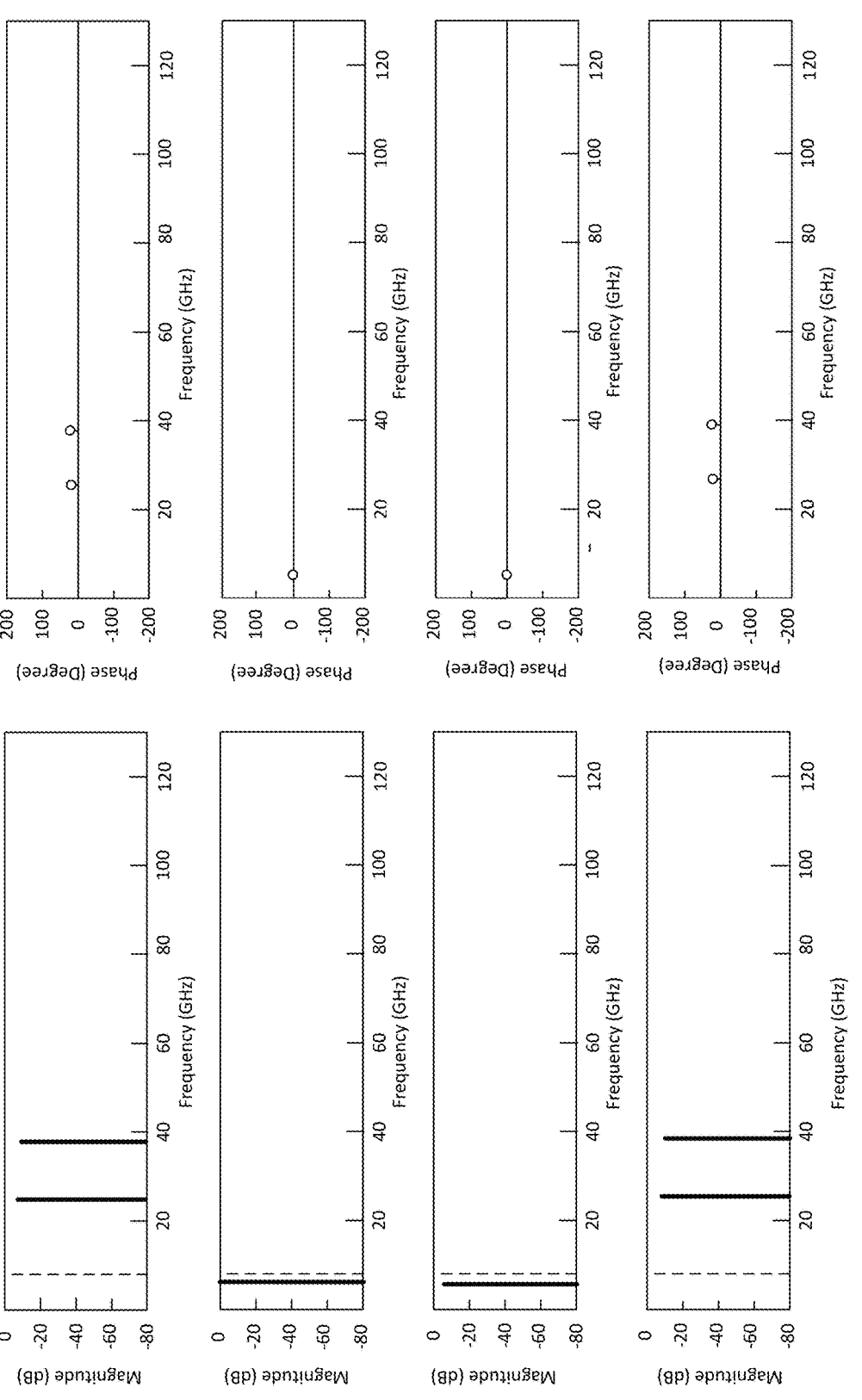
FIG. 22 shows frames of a WSA for two tones of signals.
Figure 23:
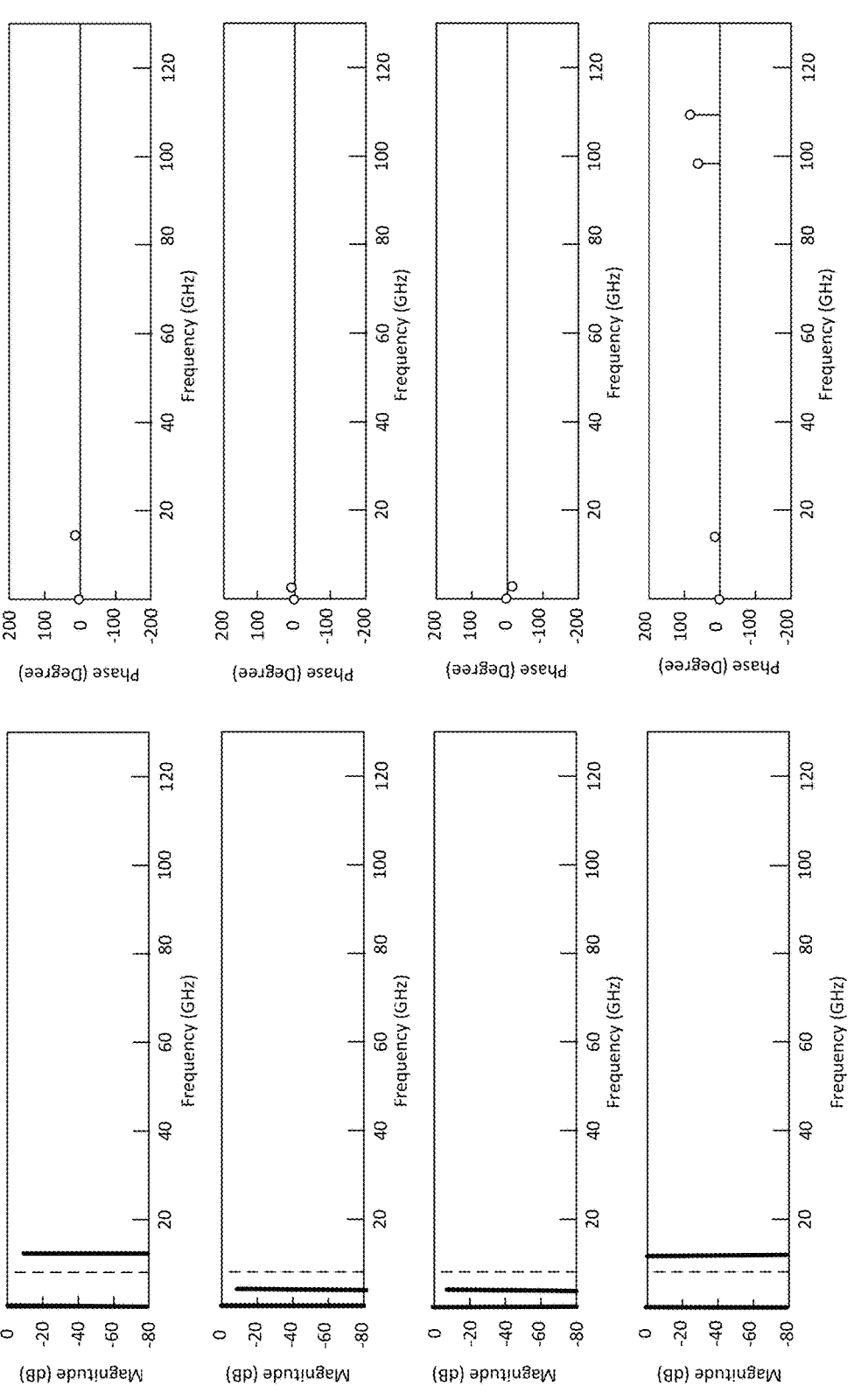
FIG. 23 shows frames of a WSA for signals with DC components.

In the frame shown in FIG. 22, both magnitude and phase spectra are different for the two pipes, compared to the frame of FIG. 14. The spectrum reconstruction algorithms recover the analog spectrum. Finally, the frame shown in FIG. 23 shows the calibration results including DC component.

Figures 24, 25:
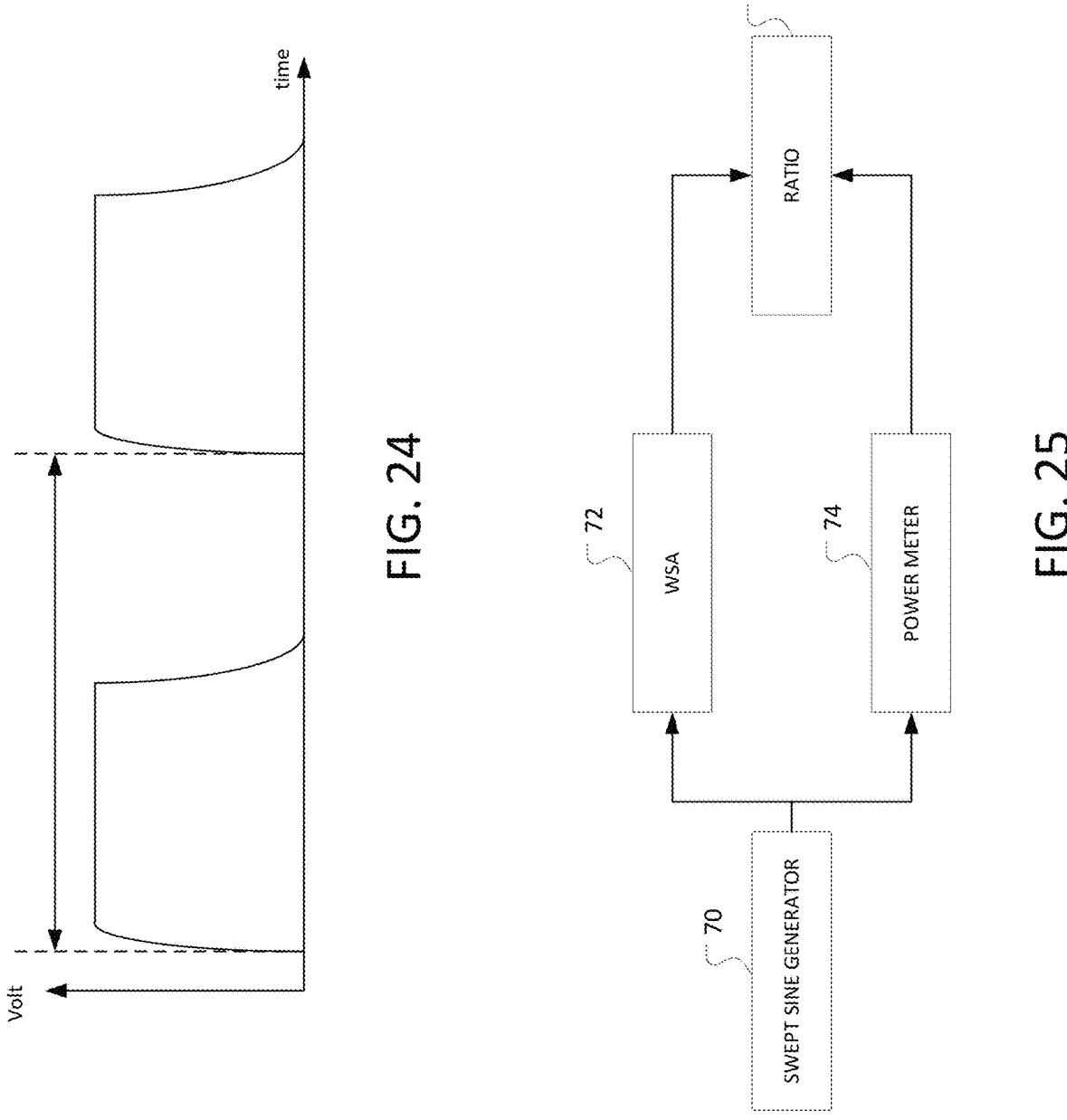
FIG. 24 shows an embodiment of a step signal used for ADC pipe frequency response characterization.
FIG. 25 shows an embodiment of a WSA magnitude frequency response characterization using a swept sine signal.

In order to adjust for the mismatch between the pipes, the process needs to characterize the frequency responses of the two pipes before applying for spectrum reconstruction. One process of characterization may involve using pulse generator or a step signal generator. The process may characterize the pulse or step signal itself to use it as reference. FIG. 24 shows a step signal. The instrument operating in the RET oscilloscope mode acquires the pulse or step signal by the two pipes. The RET oscilloscope mode acquires the equivalent time samples for the pulse or step signal. The equivalent time samples undergoing resampling to have uniformed spaced samples as shown in FIG. 16.

As discussed above, the clock recovery results in a pattern waveform having uniformly spaced samples. Performing FFT on the uniformly spaced samples can obtain the spectrum of the samples. The ratio of the obtained spectrum and the spectrum of reference makes the frequency response of the pipe.

Optionally, the process may use a swept sine signal generator 70 to get more accurate magnitude responses of the pipes as shown in FIG. 25. Because the swept sine signal's energy concentrates at one frequency at a time, it has high signal to noise ratio. A power meter 74 can level the swept sine signal. When two pipes acquire samples, the samples could be aliased when the frequency of the sine signal is beyond the Nyquist frequency of each pipe. The aliasing happens in a deterministic way, the spectrum magnitude at the aliased frequency acquired by the WSA 72 is divided by the magnitude read from the power meter to get the ratio 76 of the magnitude responses of the pipes. Note that there are isolated frequencies where the two pipes cannot get a stable reading of the spectrum magnitude, for example, when the sine signal is at integer multiples of the Nyquist frequency of each pipe. Interpolation from the neighboring frequencies can obtain the frequency response at these isolated frequencies.

The process can characterize the bandpass filters separately and then combine the characterization of the pipes. This approach performs the pipes characterization without the bandwidth filters in this approach. The process may also characterize the bandpass filters together with the pipes. The process feeds the calibration signal into the bandpass filters.

The resulting instrument combines RET oscilloscope and WSA functionality. This allows user to use one instrument for both parts of the network. Using a calibration process, the reconstruction of the analog signal across all frequencies for both the backhaul and the fronthaul becomes more accurate.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the disclosed technologies are provided below. An embodiment of the technologies may include one or more, and any combination of, the examples described below.

Example 1 is a test and measurement instrument, comprising: one or more channels to receive a signal under test, each channel comprising an input port, a filter, and a sampler; at least one analog-to-digital converter (ADC), the at least one ADC having two pipes connected to the sampler of one channel of the one or more channels, the at least one ADC to produce digital samples of the signal under test at a sample rate; and one or more processors configured to execute code that causes the one more processors to: acquire a spectrum of the digital samples for each pipe in the at least one ADC; and use the spectrums of the digital samples for each pipe in the at least one ADC to reconstruct the spectrum of the signal under test.

Example 2 is the test and measurement instrument of Example 1, wherein the input port comprises one of an electrical port, an optical port, and a wireless port.

Example 3 is the test and measurement instrument of either of Examples 1 or 2, wherein the code that causes the one or more processors to acquire a spectrum of the digital samples for each pipe comprises performing a Fast Fourier Transform (FFT) of the digital samples for each pipe.

Example 4 is the test and measurement instrument of any of Examples 1 through 3, wherein the filter comprises a bandpass filter.

Example 5 is the test and measurement instrument of Example 4, wherein the bandpass filter has a bandwidth greater than a target bandwidth of the WSA and narrower than the sample rate.

Example 6 is the test and measurement instrument of any of Examples 1 through 5, wherein the one or more channels comprises multiple channels.

Example 7 is the test and measurement instrument of Example 6, wherein the at least one ADC comprises two ADCs, each ADC having two or more pipes.

Example 8 is the test and measurement instrument of any of Examples 1 through 7, wherein the code that causes the one or more processors to use the spectrum of the digital samples comprises combining the spectrums of the two pipes and a starting frequency to reconstruct the spectrum.

Example 9 is the test and measurement instrument of Example 8, wherein the code that causes the one or more processors to combine the spectrum of the two pipes comprises code to cause the one or more processors to: derive first and second constants using frequencies derived from low frequency components of spectrums of the two pipes; and use the two constants and the low frequency components of the spectrums of the two pipes.

Example 10 is the test and measurement instrument of Example 8, wherein the starting frequency is between a multiple of the sample rate and a multiple of the sample rate minus the Nyquist frequency.

Example 11 is the test and measurement instrument of Example 8, wherein the starting frequency is between the sample rate and a multiple of the sample rate plus the Nyquist frequency.

Example 12 is the test and measurement instrument of any of Examples 1 through 11, wherein the one or more processors are further configured to calibrate the pipes in each ADC.

Example 13 is the test and measurement instrument of Example 11, wherein the code that causes the one or more processors to calibrate the pipes in each ADC comprises code that causes the one or more processors to characterize one or more of each pipe in each ADC, the filter, and the sampler associated with each pipe to acquire a frequency spectrum for each pipe.

Example 14 is a method of operating a test and measurement device, comprising: receiving a signal under test through a channel of the test and measurement device, the channel comprising an input port, a filter, and a sampler; producing digital samples of the signal under test at a sample rate using an analog-to-digital converter (ADC), the ADC having two pipes connected to the sampler of the channel; acquiring a spectrum of the digital samples for the two pipes in the ADC; and using the spectrums of the digital samples for the two pipes in the ADC to reconstruct the spectrum of the signal under test.

Example 15 is the method of Example 14, wherein using the spectrums of the digital samples comprises combining the spectrums of the two pipes and a starting frequency.

Example 16 is the method of Example 15, wherein using the spectrums of the digital samples comprises: deriving first and second constants using frequencies derived from low frequency components of spectrums of the two pipes; and using the two constants and the low frequency components of the spectrums of the two pipes.

Example 17 is a method of calibrating a test and measurement instrument operating as a wideband signal analyzer, comprising: characterizing pipes of an analog-to-digital converters (ADC) to produce frequency responses of each pipe; acquiring a spectrum of digital samples for each pipe in the at least one ADC; and adjust the spectrums of the digital samples based upon the frequency responses of each pipe; and use the adjusted spectrums of the digital samples for all pipes of each ADC to reconstruct the spectrum of signals under test.

Example 18 is the method of Example 17, wherein characterizing the pipes comprises: applying a signal to a bandpass (BP) filter; using a sampler to sample the signal from the BP filter; feeding the samples from the BP filter into each pipe of the ADC; using the test and measurement instrument to acquire samples from each pipe; and obtaining the spectrum of the samples to determine the frequency response.

Example 19 is the method of either of Examples 17 or 18, wherein characterizing the pipes of the ADC includes characterizing one or more of the BP filter, the sampler, and the ADC together or separately.

Example 20 is the method of Example 18, further comprising leveling the signal using a power meter.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although specific aspects of this disclosure have been illustrated and described for purposes of illustration, it will be understood that various modifications may be made without departing from the spirit and scope of the invention. Accordingly, the invention should not be limited except as by the appended claims.

The invention claimed is:

1. A test and measurement instrument, comprising:
one or more channels to receive a signal under test, each channel comprising an input port, a filter, and a sampler;
at least one analog-to-digital converter (ADC), the at least one ADC having two pipes connected to the sampler of one channel of the one or more channels, the at least one ADC to produce digital samples of the signal under test at a sample rate; and
one or more processors configured to execute code that causes the one more processors to:
acquire a spectrum of the digital samples for each pipe in the at least one ADC; and
use the spectrums of the digital samples for each pipe in the at least one ADC to reconstruct the spectrum of the signal under test.

2. The test and measurement instrument as claimed in claim 1, wherein the input port comprises one of an electrical port, an optical port, and a wireless port.

3. The test and measurement instrument as claimed in claim 1, wherein the code that causes the one or more processors to acquire a spectrum of the digital samples for each pipe comprises performing a Fast Fourier Transform (FFT) of the digital samples for each pipe.

4. The test and measurement instrument as claimed in claim 1, wherein the filter comprises a bandpass filter.

5. The test and measurement instrument as claimed in claim 4, wherein the bandpass filter has a bandwidth greater than a target bandwidth of the WSA and narrower than the sample rate.

6. The test and measurement instrument as claimed in claim 1, wherein the one or more channels comprises multiple channels.

7. The test and measurement instrument as claimed in claim 6, wherein the at least one ADC comprises two ADCs, each ADC having two or more pipes.

8. The test and measurement instrument as claimed in claim 1, wherein the code that causes the one or more processors to use the spectrum of the digital samples comprises combining the spectrums of the two pipes and a starting frequency to reconstruct the spectrum.

9. The test and measurement instrument as claimed in claim 8, wherein the code that causes the one or more processors to combine the spectrum of the two pipes comprises code to cause the one or more processors to:
derive first and second constants using frequencies derived from low frequency components of spectrums of the two pipes; and
use the two constants and the low frequency components of the spectrums of the two pipes.

10. The test and measurement instrument as claimed in claim 8, wherein the starting frequency is between a multiple of the sample rate and a multiple of the sample rate minus the Nyquist frequency.

11. The test and measurement instrument as claimed in claim 8, wherein the starting frequency is between the sample rate and a multiple of the sample rate plus the Nyquist frequency.

12. The test and measurement instrument as claimed in claim 1, wherein the one or more processors are further configured to calibrate the pipes in each ADC.

13. The test and measurement instrument as claimed in claim 11, wherein the code that causes the one or more processors to calibrate the pipes in each ADC comprises code that causes the one or more processors to characterize one or more of each pipe in each ADC, the filter, and the sampler associated with each pipe to acquire a frequency spectrum for each pipe.

14. A method of operating a test and measurement device, comprising:
receiving a signal under test through a channel of the test and measurement device, the channel comprising an input port, a filter, and a sampler;
producing digital samples of the signal under test at a sample rate using an analog-to-digital converter (ADC), the ADC having two pipes connected to the sampler of the channel;
acquiring a spectrum of the digital samples for the two pipes in the ADC; and
using the spectrums of the digital samples for the two pipes in the ADC to reconstruct the spectrum of the signal under test.

15. The method as claimed in claim 14, wherein using the spectrums of the digital samples comprises combining the spectrums of the two pipes and a starting frequency.

16. The method as claimed in claim 15, wherein using the spectrums of the digital samples comprises:
deriving first and second constants using frequencies derived from low frequency components of spectrums of the two pipes; and
using the two constants and the low frequency components of the spectrums of the two pipes.

17. A method of calibrating a test and measurement instrument operating as a wideband signal analyzer, comprising:
characterizing pipes of an analog-to-digital converters (ADC) to produce frequency responses of each pipe;
acquiring a spectrum of digital samples for each pipe in the at least one ADC; and
adjusting the spectrums of the digital samples based upon the frequency responses of each pipe; and
using the adjusted spectrums of the digital samples for all pipes of each ADC to reconstruct the spectrum of signals under test.

18. The method as claimed in claim 17, wherein characterizing the pipes comprises:
applying a signal to a bandpass (BP) filter;
using a sampler to sample the signal from the BP filter;
feeding the samples from the BP filter into each pipe of the ADC;
using the test and measurement instrument to acquire samples from each pipe; and
obtaining the spectrum of the samples to determine the frequency response.

19. The method as claimed in claim 17, wherein characterizing the pipes of the ADC includes characterizing one or more of the BP filter, the sampler, and the ADC together or separately.

20. The method as claimed in claim 18, further comprising leveling the signal using a power meter.

* * * * *